United States Patent
Huang et al.

(10) Patent No.: US 11,005,473 B2
(45) Date of Patent: May 11, 2021

(54) VOLTAGE DIFFERENCE MEASUREMENT CIRCUIT AND ASSOCIATED VOLTAGE DIFFERENCE MEASURING METHOD

(71) Applicant: Realtek Semiconductor Corp., HsinChu (TW)

(72) Inventors: Shih-Hsiung Huang, Miaoli County (TW); Liang-Huan Lei, Kaohsiung (TW); Liang-Wei Huang, Hsinchu (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 17/006,910

(22) Filed: Aug. 31, 2020

(65) Prior Publication Data
US 2021/0091766 A1  Mar. 25, 2021

(30) Foreign Application Priority Data

Sep. 23, 2019 (TW) ................. 108134183

(51) Int. Cl.
H03K 17/22 (2006.01)
H03K 17/0814 (2006.01)
H03M 1/00 (2006.01)
H03K 3/356 (2006.01)

(52) U.S. Cl.
CPC ..... *H03K 17/223* (2013.01); *H03K 3/356008* (2013.01); *H03K 3/356069* (2013.01); *H03K 17/08142* (2013.01); *H03M 1/001* (2013.01)

(58) Field of Classification Search
CPC ........... H03K 17/223; H03K 3/356069; H03K 17/08142; H03K 3/356008; H03M 1/001

USPC .......................................... 327/108
See application file for complete search history.

(56) References Cited

U.S. PATENT DOCUMENTS

| 2010/0123612 | A1* | 5/2010 | Zamprogno | H03F 3/505 341/158 |
| 2013/0113650 | A1* | 5/2013 | Behbahani | G01S 11/06 342/27 |
| 2015/0008930 | A1* | 1/2015 | Miyamoto | G01R 31/52 324/426 |
| 2016/0344403 | A1* | 11/2016 | Sonnaillon | H02M 3/157 |

OTHER PUBLICATIONS

Ilter Ozkaya ,"A 50V Input Range 14bit 250kS/s ADC with 97.8dB SFDR and 80.2dB SNR", IEEE, 2014.

\* cited by examiner

*Primary Examiner* — Ryan Jager
(74) *Attorney, Agent, or Firm* — Winston Hsu

(57) ABSTRACT

The present invention provides a voltage difference measurement circuit comprising a level shifting circuit, an ADC and a calculation circuit. In the operations of the voltage difference measurement circuit, the level shifting circuit adjusts levels of a supply voltage and a ground voltage to generate an adjusted supply voltage and an adjusted ground voltage, respectively. The ADC performs an analog-to-digital converting operation upon the adjusted supply voltage and the adjusted ground voltage to generate a first digital value and a second digital value, respectively. The calculation circuit calculates a voltage difference between the supply voltage and the ground voltage according to the first digital value and the second digital value.

12 Claims, 7 Drawing Sheets

VOLTAGE DIFFERENCE MEASUREMENT CIRCUIT AND ASSOCIATED VOLTAGE DIFFERENCE MEASURING METHOD

BACKGROUND OF THE INVENTION

1. Field of the Invention

The invention relates to voltage measurement, and more particular, to a voltage difference measurement circuit.

2. Description of the Prior Art

Because a bonding wire connected to a chip has parasitic inductance, parasitic resistance and parasitic capacitance, a supply voltage (or a power supply voltage) of the chip may fluctuate, that is, if the supply voltage is 1.1 volts (V), the supply voltage may fluctuate between 0.9V-1.3V. In addition, a voltage difference between the supply voltage and a ground voltage has a considerable impact on the operating speed of digital circuit, power consumption and service life. Therefore, the prior art usually sets a measurement circuit in a chip having specific application to measure the supply voltage and ground voltage. However, since both the supply voltage and the ground voltage have the fluctuation, and the working range of the measurement circuit is usually between the supply voltage and the ground voltage, the traditional measurement circuit cannot accurately measure the voltage difference between the supply voltage and the ground voltage. For example, suppose that the supply voltage is 1.1V and the ground voltage is 0V, if the supply voltage is 1.1V+0.2V after encountering the voltage fluctuation, and the ground voltage is 0V+0.1V after encountering the voltage fluctuation, then because the voltage exceeds the working range of the measuring circuit 0V-1.1V, the measurement circuit will misjudge the voltage difference between the supply voltage and the ground voltage as 1.1V-0.1V=1.0V. In another example, if the supply voltage is 1.1V-0.2V after encountering the voltage fluctuation, and the ground voltage is 0V-0.3V after encountering the voltage fluctuation, then because the ground voltage exceeds the working range of the measurement circuit 0-1.1V, the measurement circuit will misjudge the voltage difference between the supply voltage and the ground voltage as 1.0V-0V=0.9V.

In order to solve the above problems, some chips further provide a set of higher supply voltage (for example, greater than 1.1V) and a negative voltage (for example, less than the ground voltage (e.g. 0V)) for the measurement circuit. However, these additional power supplies significantly increase chip costs. In addition, another solution is to attenuate the supply voltage before being measured by the measurement circuit. However, the digital code will need to use a multiplier to compensate the attenuation part due to the attenuator, thus increasing the complexity of the circuit and cost. In addition, the use of attenuator cannot solve the voltage fluctuation problem.

SUMMARY OF THE INVENTION

It is therefore an objective of the present invention to provide a voltage difference measurement circuit, which can use a simple circuit to accurately measure the voltage difference between the supply voltage and the ground voltage, to solve the above-mentioned problems.

According to one embodiment of the present invention, a voltage difference measurement circuit comprising a level shifting circuit, an analog-to-digital converter (ADC) and a calculation circuit is disclosed. In the operations of the voltage difference measurement circuit, the level shifting circuit adjusts levels of a supply voltage and a ground voltage to generate an adjusted supply voltage and an adjusted ground voltage, respectively. The ADC performs an analog-to-digital converting operation upon the adjusted supply voltage and the adjusted ground voltage to generate a first digital value and a second digital value, respectively. The calculation circuit calculates a voltage difference between the supply voltage and the ground voltage according to the first digital value and the second digital value.

According to another embodiment of the present invention, a voltage difference measuring circuit is disclosed, wherein the voltage difference measuring method comprises the steps of: using a level shifting circuit to adjust levels of a supply voltage and a ground voltage to generate an adjusted supply voltage and an adjusted ground voltage, respectively; performing an analog-to-digital converting operation upon the adjusted supply voltage and the adjusted ground voltage to generate a first digital value and a second digital value, respectively; calculating a voltage difference between the supply voltage and the ground voltage according to the first digital value and the second digital value These and other objectives of the present invention will no doubt become obvious to those of ordinary skill in the art after reading the following detailed description of the preferred embodiment that is illustrated in the various figures and drawings.

DETAILED DESCRIPTION

Figure 1:
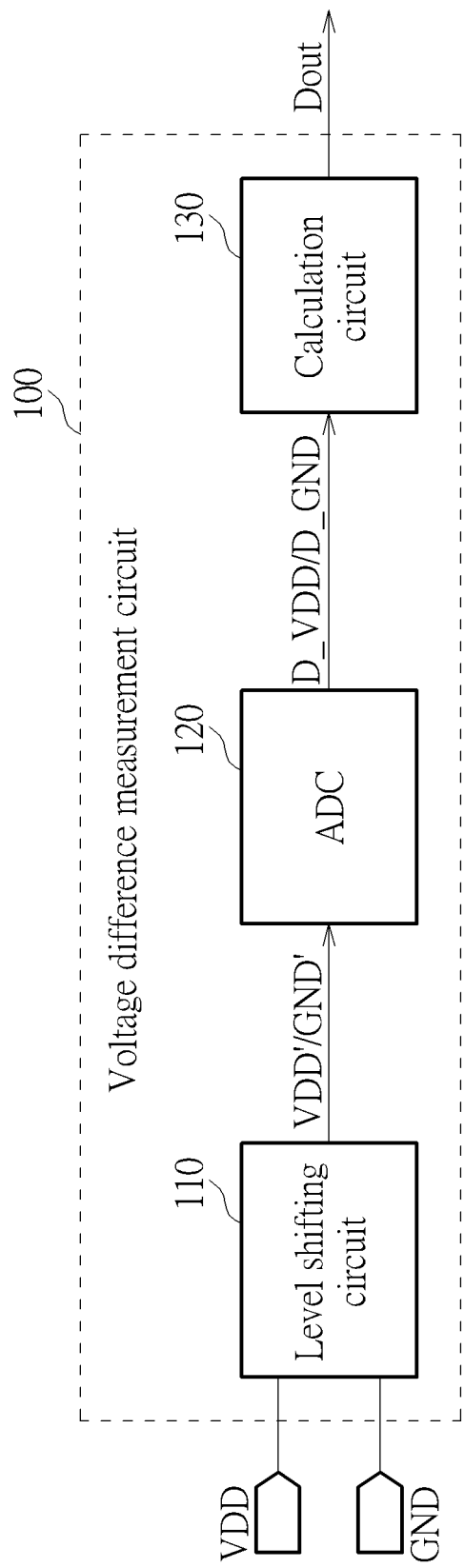
FIG. 1 is a diagram illustrating a voltage difference measurement circuit according to one embodiment of the present invention.

FIG. 1 is a diagram illustrating a voltage difference measurement circuit 100 according to one embodiment of the present invention. As shown in FIG. 1, the voltage difference measurement circuit 100 comprises a level shifting circuit 110, an ADC 120 and a calculation circuit 130. In this embodiment, the voltage difference measurement circuit 100 is configured to measure a supply voltage VDD and a ground voltage GND, and calculate a voltage difference Dout of the supply voltage VDD and the ground voltage GND.

In the operation of the voltage difference measurement circuit 100, the level shifting circuit 110 is configured to adjust the levels of the supply voltage VDD and the ground voltage GND to generate an adjusted supply voltage VDD' and an adjusted ground voltage GND', respectively, where the adjusted supply voltage VDD' and the adjusted ground voltage GND' are still within the operating range of the ADC 120 even if suffering the voltage fluctuation. Then, the ADC 120 performs the analog-to-digital converting operation on the adjusted supply voltage VDD' and the adjusted ground voltage GND' to generate a first digital value D_VDD and a second digital value D_GND. Finally, the calculation circuit 130 refers to the first digital value D_VDD and the second digital value D_GND to calculate the voltage difference Dout of the supply voltage VDD and the ground voltage GND. In this embodiment, the level shifting circuit 110 and the ADC 120 generate a plurality of first digital values D_VDD and a plurality of second digital values D_GND at a plurality of different time points, for the calculation circuit 130 to calculate the voltage difference Dout. For example, the level shifting circuit 110 can sequentially generate the adjusted supply voltage VDD', the adjusted ground voltage GND', the adjusted supply voltage VDD', the adjusted ground voltage GND', etc., and then the ADC sequentially generates the first digital value D_VDD, the second digital value D_GND, the first digital value D_VDD, the second digital value D_GND, etc., and then the calculation circuit 130 calculates an average value of the first digital values D_VDD and an average value of the second digital values D_GND, and voltage difference Dout is calculated by calculating a difference between the average value of the first digital values D_VDD and the average value of the second digital values D_GND.

Figure 2:
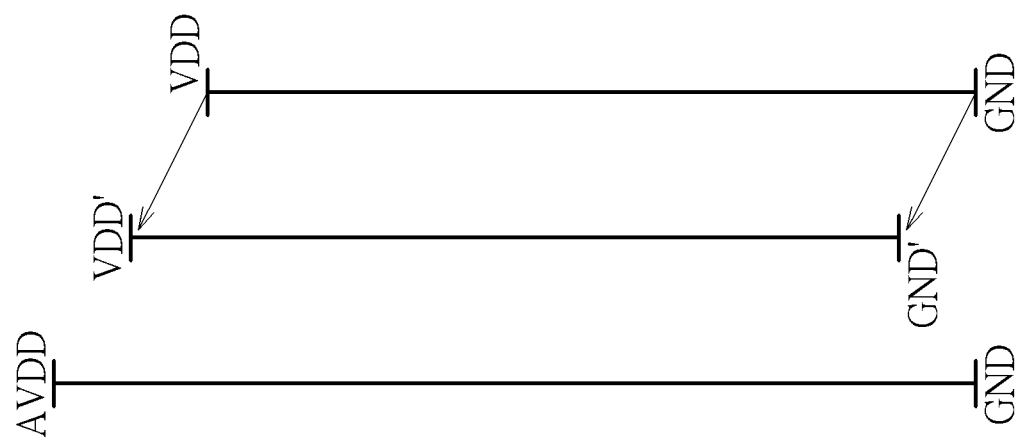
FIG. 2 is a diagram of boosting the supply voltage and the ground voltage according to one embodiment of the present invention.

In one embodiment, if the analog voltage range that the ADC 120 can handle is GND–AVDD, and AVDD is greater than the supply voltage VDD, the level shifting circuit 110 can directly increase/boost the supply voltage VDD and the ground voltage GND by a specific voltage level to generate the adjusted supply voltage VDD' and the adjusted ground voltage GND' as shown in FIG. 2, for the operations of the ADC 120. For example, if AVDD, VDD and GND are 1.8V, 1.1V and 0V, respectively, and the fluctuation range of the ground voltage GND is (−0.1)V to 0.1V, the deviation range of the ADC 120 itself is (−0.012)V-0.012V, the level shifting circuit 110 can increase the supply voltage VDD and the ground voltage GND by at least 0.1V+0.012V=0.112V, so that the adjusted ground voltage GND' will not be below 0V even if in the worst case. As described above, since the adjusted supply voltage VDD' and the adjusted ground voltage GND' generated by the level shifting circuit 110 can be guaranteed to be within the analog voltage range that the ADC 120 can handle, the first digital value D_VDD and the second digital value D_GND generated by the ADC 120 can accurately reflect the adjusted supply voltage VDD' and the adjusted ground voltage GND', and the calculation circuit 130 can also simply directly subtract the second digital value D_GND from the first digital value D_VDD to obtain the voltage difference Dout between the supply voltage VDD and the ground voltage GND.

Figure 3:
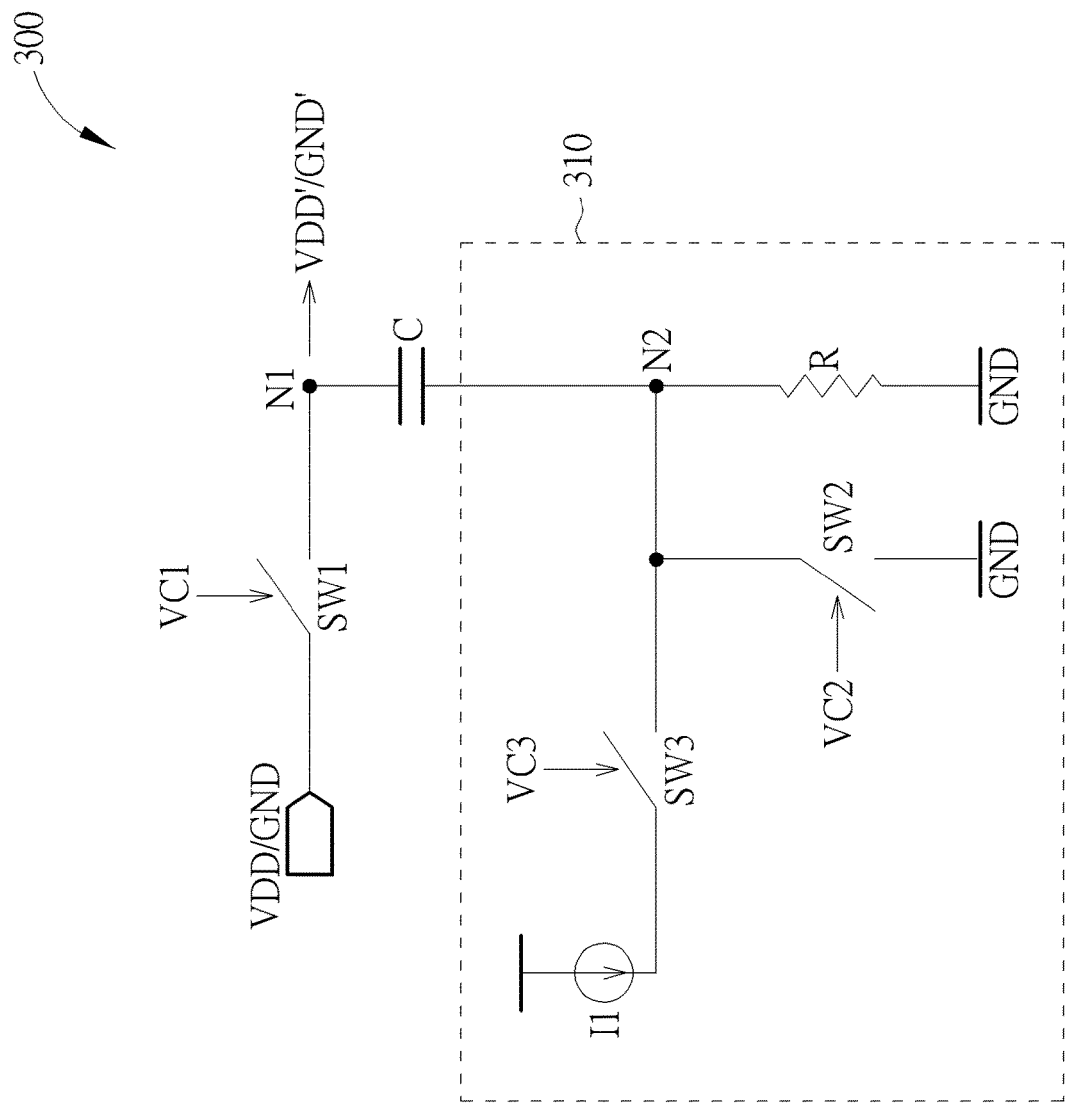
FIG. 3 is a diagram illustrating the level shifting circuit shown in FIG. 2.

FIG. 3 is a diagram illustrating a level shifting circuit 300 shown in FIG. 2, wherein the level shifting circuit 300 is the level shifting circuit 110 shown in FIG. 1. As shown in FIG. 3, the level shifting circuit 300 comprises a switch SW1, a capacitor C and a control circuit 310, wherein the control circuit 310 comprises a resistor R, two switches SW2 and SW3 and a current source IL In the operations of the level shifting circuit 300, the level shifting circuit 300 can alternately boost the levels of the supply voltage VDD and the ground voltage GND. Specifically, for the boosting operation of the supply voltage VDD, the level shifting circuit 300 firstly operates in a sample phase. At this time, the switches SW1, SW2 and SW3 are enabled, enabled and disabled based on control signals VC1, VC2 and VC3, respectively, so that the voltage at a first terminal N1 of the capacitor C is VDD, and the voltage at a second terminal N2 of the capacitor C is GND. Then, the level shifting circuit 300 operates in a hold phase. At this time, the switches SW1, SW2 and SW3 are disabled, disabled and enabled based on the control signals VC1, VC2 and VC3, respectively. Since the voltage at the second terminal N2 of the capacitor C is increased from GND to a reference voltage level (for example, the current of the current source I1 times the resistance value of the resistor R), the voltage at the first terminal N1 of the capacitor C is VDD will also be increased by the reference voltage level to generate the adjusted supply voltage VDD'. Similarly, the ground voltage GND also uses the above operations in the sample phase and the hold phase to generate the adjusted ground voltage GND'.

Figure 4:
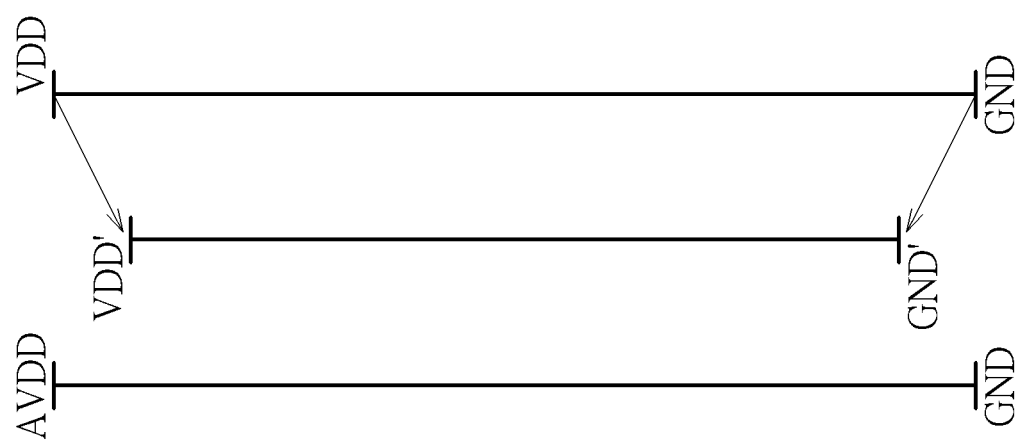
FIG. 4 is a diagram of reducing the supply voltage and boosting the ground voltage according to another embodiment of the present invention.

In another embodiment, if the analog voltage range that the DAC 120 can handle is GND–AVDD, and AVDD is approximately equal to the supply voltage VDD, the level shifting circuit 110 can reduce the level of the supply voltage VDD and increase the level of ground voltage GND to generate the adjusted supply voltage VDD' and the adjusted ground voltage GND' as shown in FIG. 4, for the operations of the ADC 120. For example, if AVDD, VDD and GND are 1.1V, 1.1V and 0V, respectively, and the fluctuation range of the ground voltage GND is (−0.1)V to 0.1V, the deviation range of the ADC 120 itself is (−0.012)V-0.012V, the level shifting circuit 110 can reduce the supply voltage VDD by at least 0.1V+0.012V=0.112V, and increase the supply voltage VDD by at least 0.1V+0.012V=0.112V, so that the adjusted supply voltage VDD' will not be above 1.1V and the adjusted ground voltage GND' will not be below 0V even if in the worst case. As described above, since the adjusted supply voltage VDD' and the adjusted ground voltage GND' generated by the level shifting circuit 110 are guaranteed to be within the analog voltage range that the ADC 120 can handle, the first digital value D_VDD and the second digital value D_GND generated by the ADC 120 can accurately reflect the adjusted supply voltage VDD' and the adjusted ground voltage GND'. The calculation circuit 130 may also adjust a difference between the first digital value D_VDD and the second digital value D_GND according to the level reduction of the supply voltage VDD and the level increase of the ground voltage GND performed by the level shifting circuit 110, to obtain the voltage difference Dout of the supply voltage VDD and the ground voltage GND.

Figure 5:
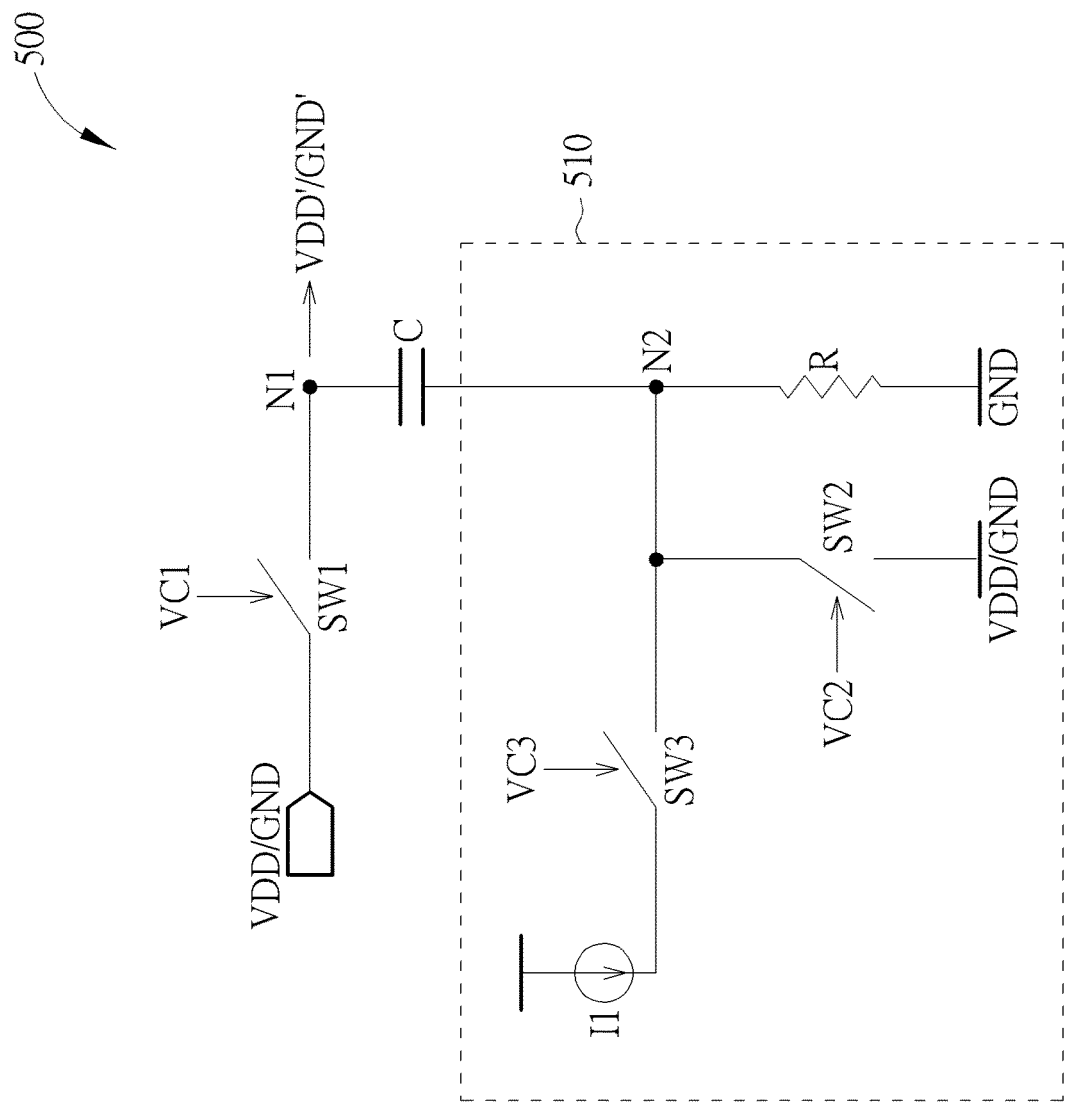
FIG. 5 is a diagram illustrating the level shifting circuit shown in FIG. 4.

FIG. 5 is a level shifting circuit 500 shown in FIG. 4 according to one embodiment of the present invention, wherein the level shifting circuit 500 is the level shifting circuit 100. As shown in FIG. 5, the level shifting circuit 500 comprises a switch SW1, a capacitor C and a control circuit 510, wherein the control circuit 510 comprises a resistor R, two switches SW2 and SW3 and a current source IL In the operations of the level shifting circuit 500, the level shifting circuit 500 can alternately boost the levels of the supply voltage VDD and the ground voltage GND. Specifically, for the reduction of the supply voltage VDD, the level shifting circuit 500 firstly operates in a sample phase. At this time, the switches SW1, SW2 and SW3 are enabled, enabled and disabled based on control signals VC1, VC2 and VC3, respectively, and the switch SW2 is arranged to connect a second terminal N2 of the capacitor C to VDD, so that the voltage at a first terminal N1 of the capacitor C is VDD, and the voltage at the second terminal N2 of the capacitor C is also VDD. Then, the level shifting circuit 500 operates in a hold phase. At this time, the switches SW1, SW2 and SW3 are disabled, disabled and enabled based on the control signals VC1, VC2 and VC3, respectively. Since the voltage at the second terminal N2 of the capacitor C is decreased to a reference voltage (for example, the current of the current source I1 times the resistance value of the resistor R), the voltage at the first terminal N1 (i.e. VDD) of the capacitor C will be decreased by the reference voltage to generate the adjusted supply voltage VDD'. On the other hand, for the boosting operation of the ground voltage GND, the level shifting circuit 500 firstly operates in the sample phase. At this time, the switches SW1, SW2 and SW3 are enabled, enabled and disabled based on control signals VC1, VC2 and VC3, respectively, and the switch SW2 is arranged to connect a second terminal N2 of the capacitor C to the ground voltage GND, so that the voltage at a first terminal N1 of the capacitor C is VDD, and the voltage at the second terminal N2 of the capacitor C is GND. Then, the level shifting circuit 500 operates in the hold phase. At this time, the switches SW1, SW2 and SW3 are disabled, disabled and enabled based on the control signals VC1, VC2 and VC3, respectively. Since the voltage at the second terminal N2 of the capacitor C is increased from GND to the reference voltage level (for example, the current of the current source I1 times the resistance value of the resistor R), the voltage at the first terminal N1 (i.e. GND) of the capacitor C will be increased by the reference voltage level to generate the adjusted ground voltage GND'.

Figure 6:
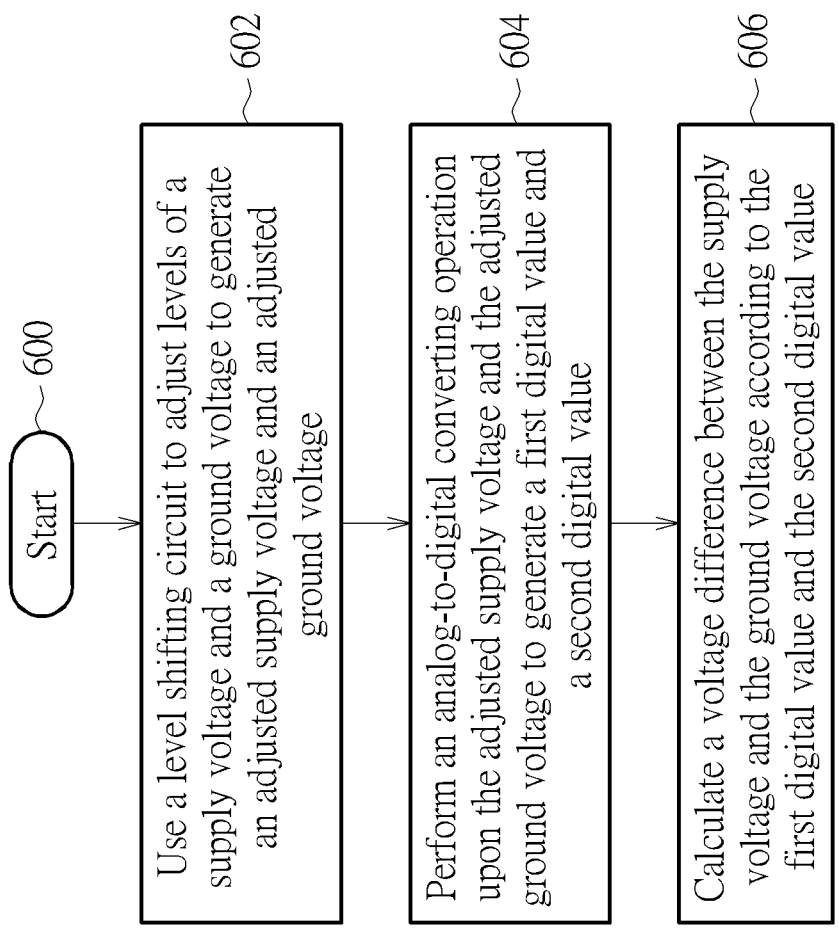
FIG. 6 is a flowchart of a voltage difference measuring method according to one embodiment of the present invention.

FIG. 6 is a flowchart of a voltage difference measuring method according to one embodiment of the present invention. Referring to the contents of the above embodiments, the flow is described as follows.

Step 600: the flow starts.

Step 602: use a level shifting circuit to adjust levels of a supply voltage and a ground voltage to generate an adjusted supply voltage and an adjusted ground voltage, respectively.

Step 604: perform an analog-to-digital converting operation upon the adjusted supply voltage and the adjusted ground voltage to generate a first digital value and a second digital value, respectively.

Step 606: calculate a voltage difference between the supply voltage and the ground voltage according to the first digital value and the second digital value.

Figure 7:
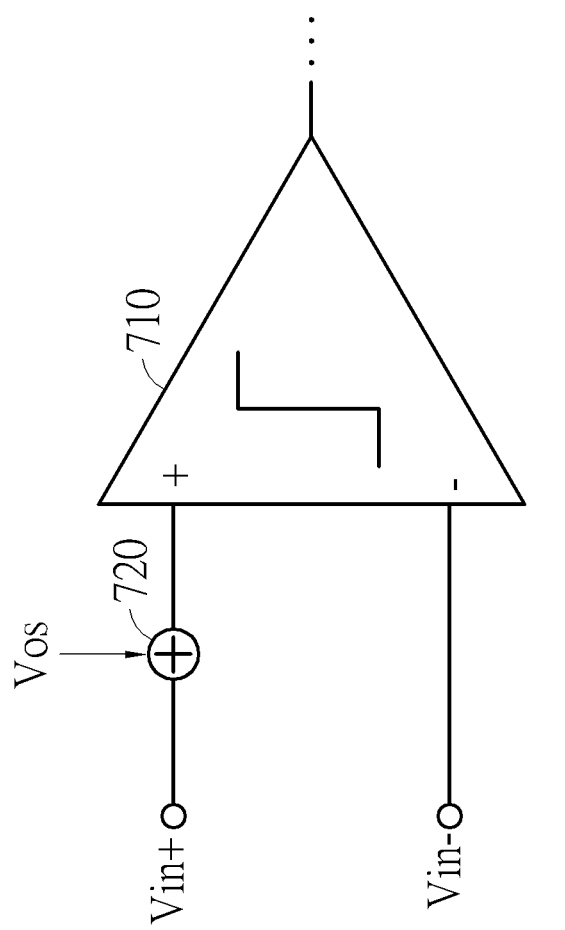
FIG. 7 is a diagram of implementing the level shifting circuit by adding a bias circuit in front of a comparator within the ADC according to one embodiment of the present invention.

In another embodiment of the present invention, the level shifting circuit 110 shown in FIG. 1 can be integrated into the ADC 120, that is the level shifting circuit 110 can be implemented by adding a bias circuit in front of a capacitor within the ADC 120. Referring to FIG. 7, a comparator 710 within the ADC 120 is configured to receive two input signals Vin+ and Vin− to generate a comparison result, wherein the input signal Vin+ can be the supply voltage VDD or the ground voltage GND shown in FIG. 1. In FIG. 7, a bias circuit 720 is configured to add a bias value Vos on the input signal Vin+, wherein the bias value Vos is a positive bias voltage in the embodiment of FIG. 2, while the bias value Vos in the embodiment of FIG. 4 is switched between the positive bias voltage and the negative bias voltage (i.e. the bias value Vos is negative bias voltage when measuring the supply voltage VDD, and the bias value Vos is positive bias voltage when measuring the ground voltage GND). In addition, the comparator 710 may be within a pipeline ADC or a successive-approximation-register (SAR) ADC.

Briefly summarized, the voltage difference measurement circuit of the present invention uses a level shifting circuit to solve the voltage fluctuation problem of the supply voltage and the ground voltage in the prior art. Therefore, the voltage difference between the supply voltage and the ground voltage can be accurately measured by using a simple circuit architecture, and the voltage difference measurement circuit itself does not need to use a voltage source lower than the ground voltage. Therefore, the complexity and manufacturing cost of the voltage difference measurement circuit can be effectively reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A voltage difference measurement circuit, comprising:
   a level shifting circuit, configured to adjust a level of a supply voltage and a level of a ground voltage to generate an adjusted supply voltage and an adjusted ground voltage, respectively;
   an analog-to-digital converter (ADC), coupled to the level shifting circuit, configured to perform an analog-to-digital converting operation on the adjusted supply voltage and the adjusted ground voltage to generate a first digital value and a second digital value, respectively; and
   a calculation circuit, coupled to the ADC, configured to calculate a voltage difference between the supply voltage and the ground voltage according to the first digital value and the second digital value.

2. The voltage difference measurement circuit of claim 1, wherein the level shifting circuit boosts the levels of the supply voltage and the ground voltage to generate the adjusted supply voltage and the adjusted ground voltage, and calculation circuit directly calculates a difference between the first digital value and the second digital value to obtain the voltage difference between the supply voltage and the ground voltage.

3. The voltage difference measurement circuit of claim 1, wherein the level shifting circuit comprises:
   a capacitor comprising a first terminal and a second terminal;
   a switch, coupled between the first terminal of the capacitor and the supply voltage or the ground voltage; and
   a control circuit, configured to couple the ground voltage or a reference voltage to the second terminal of the capacitor;
   wherein in a sample phase, the switch couple the supply voltage or the ground voltage to the first terminal of the capacitor, and the control circuit couples the ground voltage to the second terminal of the capacitor; and in a hold phase, the switch disconnected the first terminal of the capacitor from the supply voltage or the ground voltage, and the control circuit couples the ground voltage to the second terminal of the capacitor, and at this time, the first terminal of the capacitor outputs the adjusted supply voltage or the adjusted ground voltage.

4. The voltage difference measurement circuit of claim 3, wherein the level shifting circuit does not connect any power source whose voltage level is lower than the ground voltage.

5. The voltage difference measurement circuit of claim 1, wherein the level shifting circuit reduces the level of the supply voltage and boosts the level of the ground voltage to generate the adjusted supply voltage and the adjusted ground voltage, and the calculation circuit adjust a difference between the first digital value and the second digital value according to the level reduction of the supply voltage and the level increase of the ground voltage, to obtain the voltage difference of the supply voltage and the ground voltage.

6. The voltage difference measurement circuit of claim 5, wherein the level shifting circuit comprises:
a capacitor comprising a first terminal and a second terminal;
a switch, coupled between the first terminal of the capacitor and the supply voltage or the ground voltage; and
a control circuit, configured to couple the ground voltage, a first reference voltage or a second reference voltage to the second terminal of the capacitor;
wherein the level shifting circuit reduces the level of the supply voltage and boosts the level of the ground voltage at different time points, and the first terminal of the capacitor is used to generate the adjusted supply voltage or the adjusted ground voltage.

7. The voltage difference measurement circuit of claim 6, wherein in a sample phase, the switch couple the supply voltage to the first terminal of the capacitor, and the control circuit couples the second reference voltage to the second terminal of the capacitor; and in a hold phase, the switch disconnects the first terminal of the capacitor from the supply voltage, and the control circuit couples the first reference voltage to the second terminal of the capacitor, and at this time, the first terminal of the capacitor outputs the adjusted supply voltage.

8. The voltage difference measurement circuit of claim 6, wherein in a sample phase, the switch couple the ground voltage to the first terminal of the capacitor, and the control circuit couples the ground voltage to the second terminal of the capacitor; and in a hold phase, the switch disconnects the first terminal of the capacitor from the ground voltage, and the control circuit couples the first reference voltage to the second terminal of the capacitor, and at this time, the first terminal of the capacitor outputs the adjusted ground voltage.

9. The voltage difference measurement circuit of claim 6, wherein the level shifting circuit does not connect any power source whose voltage level is lower than the ground voltage.

10. A voltage difference measuring method, comprising:
using a level shifting circuit to adjust a level of a supply voltage and a level of a ground voltage to generate an adjusted supply voltage and an adjusted ground voltage, respectively;
performing an analog-to-digital converting operation on the adjusted supply voltage and the adjusted ground voltage to generate a first digital value and a second digital value, respectively; and
calculating a voltage difference between the supply voltage and the ground voltage according to the first digital value and the second digital value.

11. The voltage difference measuring method of claim 10, wherein the step of using the level shifting circuit to adjust the level of the supply voltage and the level of the ground voltage to generate the adjusted supply voltage and the adjusted ground voltage, respectively, comprises:
using the level shifting circuit to boost the levels of the supply voltage and the ground voltage to generate the adjusted supply voltage and the adjusted ground voltage; and
the step of calculating the voltage difference between the supply voltage and the ground voltage according to the first digital value and the second digital value comprises:
directly calculating a difference between the first digital value and the second digital value to obtain the voltage difference between the supply voltage and the ground voltage.

12. The voltage difference measuring method of claim 10, wherein the step of using the level shifting circuit to adjust the level of the supply voltage and the level of the ground voltage to generate the adjusted supply voltage and the adjusted ground voltage, respectively, comprises:
using the level shifting circuit to reduce the level of the supply voltage and boosts the level of the ground voltage to generate the adjusted supply voltage and the adjusted ground voltage; and
the step of calculating the voltage difference between the supply voltage and the ground voltage according to the first digital value and the second digital value comprises:
adjusting a difference between the first digital value and the second digital value according to the level reduction of the supply voltage and the level increase of the ground voltage, to obtain the voltage difference of the supply voltage and the ground voltage.

* * * * *